US008517605B2

(12) United States Patent
Grayson et al.

(10) Patent No.: US 8,517,605 B2
(45) Date of Patent: Aug. 27, 2013

(54) BIMETALLIC INTEGRATED ON-CHIP THERMOCOUPLE ARRAY

(75) Inventors: Matthew A. Grayson, Evanston, IL (US); Seda Memik, Evanston, IL (US); Jieyi Long, San Jose, CA (US); Chuanle Zhou, Evanston, IL (US); Andrea Grace Klock, Chicago, IL (US)

(73) Assignee: Northwestern University, Evanston, IL (US)

( * ) Notice: Subject to any disclaimer, the term of this patent is extended or adjusted under 35 U.S.C. 154(b) by 51 days.

(21) Appl. No.: 12/924,091

(22) Filed: Sep. 20, 2010

(65) Prior Publication Data

US 2011/0110396 A1    May 12, 2011

Related U.S. Application Data

(60) Provisional application No. 61/243,884, filed on Sep. 18, 2009.

(51) Int. Cl.
| G01K 7/00 | (2006.01) |
| G01K 1/16 | (2006.01) |
| G01K 1/00 | (2006.01) |
| G01K 11/30 | (2006.01) |
| G01K 17/00 | (2006.01) |
| G01J 5/00 | (2006.01) |

(52) U.S. Cl.
USPC ........... 374/178; 374/120; 374/121; 702/130; 702/132; 702/133; 702/134; 702/135; 702/136

(58) Field of Classification Search
USPC ................ 374/178, 120, 121, 179; 702/130, 702/132, 133, 134, 135, 136
See application file for complete search history.

(56) References Cited

U.S. PATENT DOCUMENTS

| 3,766,444 | A | * | 10/1973 | Bosch ............................ 331/60 |
| 4,482,261 | A | | 11/1984 | Dewey et al. |
| 4,558,342 | A | * | 12/1985 | Sclar ............................ 257/460 |
| 4,571,689 | A | | 2/1986 | Hildebrand et al. |
| 5,261,747 | A | * | 11/1993 | Deacutis et al. .............. 374/137 |
| 5,909,004 | A | | 6/1999 | Hedengren et al. |
| 6,666,088 | B2 | * | 12/2003 | Leung ............................ 73/488 |
| 6,898,451 | B2 | * | 5/2005 | Wuori .......................... 600/322 |
| 6,987,223 | B2 | * | 1/2006 | Schneider .................... 136/225 |
| 2006/0062439 | A1 | * | 3/2006 | Setlak .......................... 382/124 |
| 2006/0076644 | A1 | * | 4/2006 | Meyer et al. ................. 257/536 |
| 2008/0026503 | A1 | * | 1/2008 | Ryan ............................. 438/54 |
| 2008/0123238 | A1 | * | 5/2008 | Campos et al. ............... 361/103 |
| 2009/0189285 | A1 | * | 7/2009 | Colt, Jr. ....................... 257/756 |

FOREIGN PATENT DOCUMENTS

| CN | 1357930 | 7/2002 |
| DE | 37 07 631 | 9/1988 |
| JP | 1994258149 | 9/1994 |
| JP | 1994104494 | 12/1994 |
| JP | 1995218348 | 8/1995 |
| JP | 2000137042 A | * 5/2000 |

* cited by examiner

*Primary Examiner* — Freddie Kirkland, III
*Assistant Examiner* — Jamel Williams
(74) *Attorney, Agent, or Firm* — Krieg DeVault LLP

(57) ABSTRACT

An integrated circuit chip is defined by a stack of several interconnected layers. The integrated circuit chip includes at least two layers of dissimilar metal patterned to define an array of integrated bimetallic thermocouples.

23 Claims, 4 Drawing Sheets

US 8,517,605 B2

BIMETALLIC INTEGRATED ON-CHIP THERMOCOUPLE ARRAY

CROSS REFERENCE TO RELATED APPLICATIONS

The present application claims the benefit of U.S. Provisional Patent Application No. 61/243,884, filed Sep. 18, 2009, and the same is incorporated herein by reference.

GOVERNMENT RIGHTS

This invention was made with government support under Grant No FA9550-09-1-0237 awarded by the Air Force Office of Scientific Research and Grant Numbers: CNS 0546305 and CCF 0541337 awarded by the National Science Foundation. The government has certain rights in the invention.

BACKGROUND

The present application is directed to sensing technology, and more particularly, but not exclusively, to a thermocouple array for determining thermal distribution over an integrated circuit device.

Many state-of-the-art, high-performance microprocessors contain thermal sensors in order to prevent the systems from entering severe thermal conditions. Currently, off-the-shelf microprocessor designs typically adopt a diode-based and/or digital CMOS (utilizing ring oscillators and counters) sensor arrangements.

Diode-based sensor designs can have several disadvantages. Firstly, their accuracy can be affected considerably by the serial resistance of the wire connecting the remote diode and the circuit reading and processing the forward voltage of the diode. Secondly, the diodes usually exhibit a normegligible amount of nonlinearity over the normal chip operating temperature range (25° C.~100° C.). In order to meet the target accuracy, compensation circuitry with large overhead might be needed.

Thirdly, since the diodes are susceptible to process variation, each diode needs to be calibrated individually. Digital sensors, though able to achieve a higher level of accuracy, are usually associated with larger area overhead.

Baglio et al., *On-Chip Temperature Monitoring via CMOS Thermocouples in THERMINIC* (2003) proposed an integrated CMOS thermocouple-based temperature sensor structure which uses junctions between metal/p+ diffused silicon or metal/polysilicon couples, also compatible with CMOS technology. Unfortunately, doping nonuniformities can cause the Seebeck coefficient of the p+ diffusion/polysilicon strip to vary along the length of the strip, hence the Seebeck voltage of these couples will depend on the temperature profile along the strip. Also, the sensor proposed by Baglio et al. uses up silicon area because the p+ diffusion/polysilicon strips have to be manufactured in the silicon layer. Moreover, placing these proposed sensors in the computationally intensive performance-critical regions typically degrades the system performance—and yet these regions usually have the highest temperature and often would benefit most from thermal monitoring—usually forcing a trade-off between system performance and sensing accuracy.

Thus, there is an ongoing need for further contributions in this area of technology. The various inventive embodiments of the present application provide such contributions.

SUMMARY OF THE INVENTION

One embodiment of the present application includes unique integrated circuit sensing techniques including an integrated array of bimetallic thermocouples, unique methods of making and using the same with integrated circuitry, and various other unique apparatus, devices, systems, and methods relating to the same. Further embodiments, inventions, forms, objects, features, advantages, aspects, and benefits of the present application are otherwise set forth or become apparent from the description and drawings included herein.

BRIEF DESCRIPTION OF THE DRAWINGS

The description herein makes reference to the accompanying drawings wherein like reference numerals refer to like parts throughout the several views, and wherein.

DETAILED DESCRIPTION OF REPRESENTATIVE EMBODIMENTS

Figure 1:
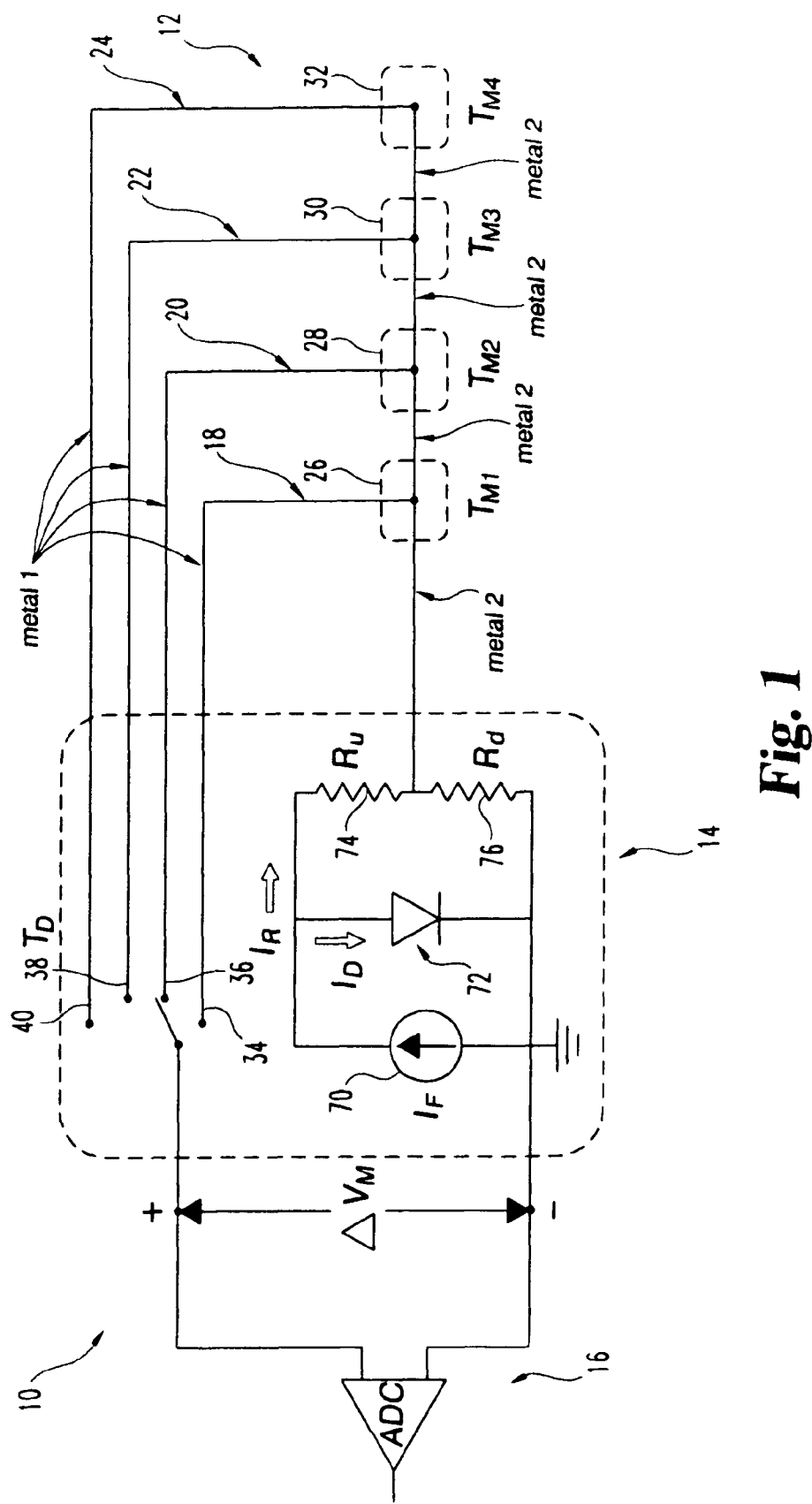
FIG. 1 is a schematic diagram of a temperature sensor.

While the present invention can take many different forms, for the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications of the described embodiments and any further applications of the principles of the invention as described herein are contemplated as would normally occur to one skilled in the art to which the invention relates.

In one embodiment of the present application, an integrated on-chip thermocouple array (IOTA) is provided. In a further embodiment, the IOTA is integral to a microchip processor or other computationally-intensive integrated circuit device susceptible to degrading effects of high operating temperatures, such as accelerated wearout, increased leakage power consumption, and destructive thermal runaway. The IOTA can be utilized to determine the thermal distribution with fine resolution over some or all of the area of the chip to reduce impacts of elevated operating temperatures and correspondingly optimize device performance.

A further embodiment includes a bimetallic thermocouple array for temperature sensing of integrated circuits. This sensor array can be prepared in a manner compatible with CMOS processing, and hence it readily can be integrated into microprocessor chips to assist with thermal management of a microprocessor. The sensor has high accuracy and low overhead, and is able to provide fine-grain runtime thermal characterization for microprocessor chips.

Among the features and embodiments of the present application is a thermocouple on-chip sensor. Further, the combination of an array of such sensors is disclosed that is combined with reference temperature circuitry to achieve greater linearity over a large temperature range. Additionally, a bimetallic form of thermocouples situated in a monitoring array can be designed in a manner that is more robust to process variations than existing techniques. In fact, this form of array can be combined with reference point circuitry in a manner that only this reference circuitry needs to be calibrated to provide desired levels of performance/accuracy of the entire system. Correspondingly, unlike diode-based sensor schemes for which each diode needs a dedicated bias current source, multiple bimetallic thermocouples can share one thermal reference circuit, which can reduce the amount of analog components that need to be utilized. Moreover, for thermocouples that are purely metallic, temperature variation along the routing paths does not impact the sensing accuracy.

It should be further appreciated that bimetallic thermocouples can be made using a standard integrated circuit contact metal for one of the two metals of each thermocouple junction, and correspondingly provide temperature measurements throughout the chip at the site of each metallic junction. According to the Seebeck effect, when a junction between two dissimilar metals is held at a different temperature than the two leads, a voltage arises at the leads proportional to the lead-to-junction temperature difference. By connecting the leads of an array of junctions to a thermal reference point, one can determine the instantaneous thermal distribution throughout the chip in desired performance regions, such as near a CPU or some other heavily used logic unit. In addition, an arbitrary number of thermocouples can be processed with minimal additional support circuitry.

Thermal sensing techniques of the present application can be very robust. Temperature variation along the routing paths does not undesirably affect the measurement of the junction temperature. With the absolute reference temperature determined at a single point of the chip, the temperatures of all thermocouple junctions can be determined relative to this single reference. Because the Seebeck coefficient of a thermocouple is constant across a large temperature range, the thermocouple signal can be highly linear with temperature. By comparison, in diode-based sensor designs. the thermal diodes are placed near the functional units whose temperature might vary substantially over time, and because thermal diodes often exhibit a significant amount of nonlinearity over a large temperature range, compensation circuitry with considerable area overhead is needed to achieve the target sensing accuracy.

FIG. 1 depicts the diagram of a temperature sensor 10 of another embodiment of the present application that includes three parts: a thermocouple array 12, thermal reference point circuitry 14 (often called the "ice-point" in thermoelectric literature) and signal processing circuitry 16. This processing circuitry 16 can implement logic in the form of hardware, software, or both, to define a thermal management module or circuit for the integrated circuit chip being monitored with the array. The thermocouples 18, 20, 22, 24 of the array 12 are each composed of two types of dissimilar metals. Each strip of metal type 1 (depicted as "metal 1") and metal type 2 (depicted as "metal 2") form a thermocouple 18, 20, 22, 24. According to the Seebeck effect, when a junction 26, 28. 30, 32 between two dissimilar metals is held at a different temperature than the two leads, a voltage arises at the leads 34, 36, 38, 40 proportional to the lead-to-junction temperature difference. In the proposed sensor design, the leads 34, 36, 38, 40 are located in the proximity of the thermal reference point. Thus, the thermocouple array 12 is capable of providing voltage signals proportional to the relative temperature at each junction. This thermal reference point, on the other hand, can generate a voltage proportional to its absolute temperature. The voltage signals are added up and fed into the signal processing circuitry which translates the voltage signals into the absolute temperature at the metal junctions. In the illustrated sensor design, a single thermal reference point is shared among multiple thermocouples 18, 20, 22, 24. Likewise, a single signal processing unit 16 can operate in a time-multiplexing fashion to accommodate multiple thermocouples 18, 20, 22, 24. Thus, the proposed sensor design can support fine-grain runtime thermal characterization of the microprocessor chips, and correspondingly resource sharing enables up-scaling of the number of thermocouples without incurring large overhead.

The first and second metals generally may be any type of suitable metal that would occur to one of ordinary skill in the art. For example, the metals may be include, copper, nickel, chromium, manganese, aluminum, iron, magnesium, platinum, rhodium, gold, tungsten, rhenium, titanium, and molybdenum. It is also contemplated that either one of the metals or both of the metals are alloys of one or more metals identified above.

In another embodiment, the proposed sensor design can be integrated with a CMOS compatible process in the metal routing layer. Al and Cu may be used to form the metal routing layers. Preferred candidates for dissimilar thermocouple metals are Ni and Cu, or their related alloys thereby requiring adding only one new metal type along with the existing copper routing layer to form the thermocouples. If two extra layers can be dedicated for the thermocouple array, then, Ni and Cr or their related alloys are suitable metals to use. For instance, a CMOS-compatible process may be used to form a layer of pure Cr on top of a poly-silicon gate. In another example, a CMOS-compatible methodology may be used to deposit two metal layers (Ni and Ti) on a silicon substrate.

Figure 2:
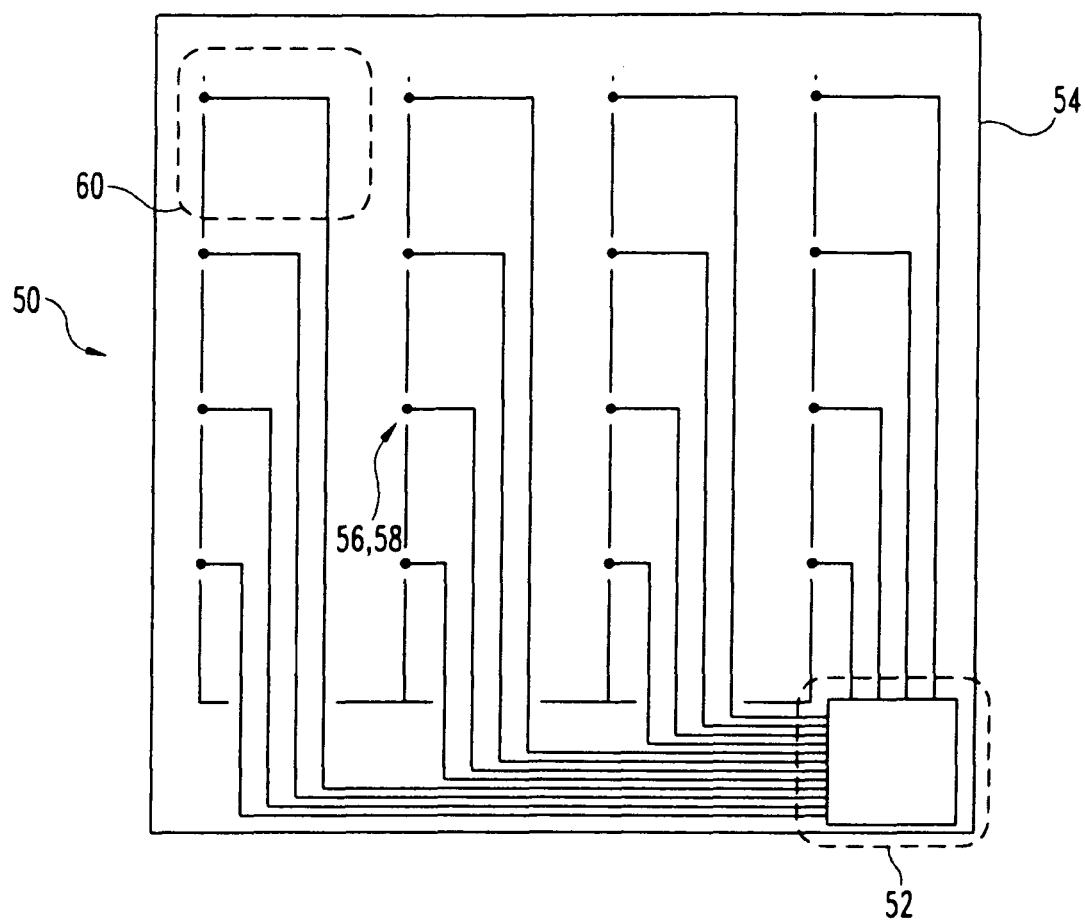
FIG. 2 is a schematic diagram of a thermocouple array and accessory circuitry on a microchip.

FIG. 2 illustrates the conceptual integration of a 4×4 thermocouple array 50 and accessory circuitry 52 into a microprocessor chip 54—as just one nonlimiting example. The accessory circuitry 52 may include, for example, the thermal reference point circuitry 14 and the signal processing circuitry 16. The vias 56 connecting the two metal layers (the vias are made of metal type 2) act as the junctions 58 of the thermocouples. In FIG. 2, the vias 56 are distributed in a 4×4 grid and only are depicted by reference numeral to preserve clarity. In practice, depending on the sensor placement strategy, the thermocouple array 50 can be distributed either uniformly or nonuniformly over the entire chip 54 or one or more selected regions thereof.

The described design allows the absolute temperature of each thermocouple to be measured as a series of the thermal reference voltage with the relative thermocouple voltage. The equations relating the circuit elements to the Seebeck voltage of the bimetallic thermocouples are derived as follows. It should be appreciated that the indicated thermal reference circuit and corresponding evaluation serve as just one specific example of a thermal reference circuit, such that the inventions of the present application should not be restricted to the same. The thermal reference circuitry 14, shown in FIG. 1, includes a current source 70, a diode 72, and two resistors 74, 76 These circuit elements and the ends of the metal strips are located in close proximity. Let us denote the absolute temperature in this region by $T_D$.

The forward voltage drop of the diode depends linearly on temperature $$V_D = V_{D0} + \frac{nk_B}{q}\ln\left(\frac{I_D}{I_S}+1\right) \cdot T_D \tag{1}$$

Here $V_D$ is the forward voltage of the p-n junction at temperature $T_D$; $V_{D0}$ is a constant, representing the forward junction voltage at 0 K (by linear extension); n is the ideality factor of the diode; $k_B$ and q are the Boltzmann constant and electronic charge, respectively; $I_D$ is the current going through the diode; and $I_s$ is the saturation current of the diode. The current source provides a constant current $I_F$. The two resistors $R_u$ and $R_d$ form a voltage divider. The voltage drop on resistor $R_d$ is $$V_{Rd} = (I_F - I_D)R_d = \frac{R_d}{R_u + R_d}V_D \quad (2)$$

$V_{Rd}$ is required to depend linearly on temperature and has the same temperature coefficient as the thermocouple, $\beta$. This requirement leads to $$V_{Rd} = (I_F - I_D)R_d = V_{Rd0} + \beta \cdot T_D \quad (3)$$

where $V_{Rd0}$ is the voltage drop on $R_d$ at 0 K. Setting $T_d$ to 0 K, according to Equations (1) and (2), then $$V_{Rd0} = \frac{R_d}{R_u + R_d}V_{D0} \quad (4)$$

Equations (2-4) give $$I_D = I_F - \frac{\beta}{R_d} \cdot T_D - \frac{V_{D0}}{R_u + R_d} \quad (5)$$

and hence, $$V_D = V_{D0} + \frac{nk_B}{q}\ln\left(\frac{I_F}{I_S} - \frac{\beta}{I_S R_d} \cdot T_D - \frac{V_{D0}}{I_S(R_u + R_d)} + 1\right) \cdot T_D \quad (6)$$

Denote $$\alpha = \frac{R_d}{R_u + R_d}\frac{nk_B}{q}\ln\left(\frac{I_F}{I_S} - \frac{\beta}{I_S R_d} \cdot T_D - \frac{V_{D0}}{I_S(R_u + R_d)} + 1\right) \quad (7)$$

The measured voltage $V_m$ is equal to $$V_M = \frac{R_d}{R_u + R_d}V_{D0} + \alpha \cdot T_D + \beta \cdot (T_M - T_D) \quad (8)$$
$$= \beta \cdot T_M + (\alpha - \beta) \cdot T_D + \frac{R_d}{R_u + R_d}V_{D0}$$

This gives $$T_M = \frac{V_M}{\beta} - \left(\frac{\alpha}{\beta} - 1\right)T_D - \frac{R_d}{\beta(R_u + R_d)}V_{D0} \quad (9)$$

It is desired for $V_m$ to be independent of $T_D$, which means the $\alpha/\beta$ ratio needs to be equal to 1. According to Equation (7):

$$I_F = I_S \exp\left(\frac{\beta q}{nk_B}\frac{R_u + R_d}{R_d}\right) + \frac{\beta T_D}{R_d} + \frac{V_{D0}}{R_u + R_d} + I_S \quad (10)$$

To make $\alpha/\beta$ equal to 1, the temperature can be measured in the following way: In the sensor calibration phase, place the entire chip in a cabinet which can provide constant ambient temperatures $T_{A1}$ and $T_{A2}$. Then, according to Equation (8):

$$V_{M1} = \frac{R_d}{R_u + R_d}V_{D0} + \alpha \cdot T_{A1} \quad (11)$$

$$V_{M2} = \frac{R_d}{R_u + R_d}V_{D0} + \alpha \cdot T_{A2} \quad (12)$$

Measuring the voltages $V_{M1}$ and $V_{M2}$ and solving the above linear equations give us the values of $\alpha$ and $R_d V_{D0}/(R_u + R_d)$. In the case that $\alpha/\beta$ can be made very close to 1, the temperature $T_m$ can be estimated by $$T_M = \frac{V_M}{\beta} - \frac{R_d}{\beta(R_u + R_d)}V_{D0} \quad (13)$$

while the error term is $$-\left(\frac{\alpha}{\beta} - 1\right)T_D \quad (14)$$

The following description relates to the determination of values for the circuit components that reduces, if not minimizes, the dependence of temperature measurement on process variations. In order to eliminate the error term (14), $\alpha/\beta$ needs to be 1. However, even if we can determine the nominal values of the circuit parameters to have $\alpha$ and $\beta$ equal to each other, due to process and environmental variations, $\alpha$ can be different from its nominal value. For instance, it may not be possible to manufacture the current source $I_F$ and the two resistors $R_u$ and $R_d$ accurately. Two parameters of the diode, namely the saturation current $I_S$, and the ideality factor n, may deviate from their expected values. In addition $T_D$, the temperature in the proximity of the diode is not a constant, which can cause the value of $\alpha$ to fluctuate.

The impact of process and environmental variations on our sensor design is evaluated, and there is an approach to increase the tolerance of the design to variations. Assuming the deviations of the circuit parameters relative to the nominal values are small enough (within 5%, for instance), we have $$\frac{\alpha}{\beta} - 1 = \quad (15)$$
$$\frac{\Delta\alpha}{\beta} = \frac{\partial\alpha}{\partial R_u}\frac{\Delta R_u}{\beta} + \frac{\partial\alpha}{\partial R_d}\frac{\Delta R_d}{\beta} + \frac{\partial\alpha}{\partial I_F}\frac{\Delta I_F}{\beta} + \frac{\partial\alpha}{\partial I_S}\frac{\Delta I_S}{\beta} + \frac{\partial\alpha}{\partial n}\frac{\Delta n}{\beta}$$

According to Equation (7), we have $$\frac{\partial\alpha}{\partial R_u}\frac{\Delta R_u}{\beta} = \quad (16)$$
$$\left(\frac{R_u}{R_u + R_d}\frac{\alpha}{\beta} + \frac{nk_B}{q\beta}\frac{\frac{R_u R_d}{(R_u + R_d)^2}V_{D0}}{(I_F + I_S)(R_u + R_d) - \beta T_D\left(\frac{R_u}{R_d} + 1\right) - V_{D0}}\right)\frac{\Delta R_u}{R_u}$$

$$\frac{\partial\alpha}{\partial R_d}\frac{\Delta R_d}{\beta} = \quad (17)$$
$$\left(\frac{R_u}{R_u + R_d}\frac{\alpha}{\beta} + \frac{nk_B}{q\beta}\frac{BT_D + \frac{R_d 2}{(R_u + R_d)^2}V_{D0}}{(I_F + I_S)(R_u + R_d) - \beta T_D\left(\frac{R_u}{R_d} + 1\right) - V_{D0}}\right)\frac{\Delta R_d}{R_d}$$

$$\frac{\partial \alpha}{\partial I_F} \frac{\Delta I_F}{\beta} = \left( \frac{nk_B}{q\beta} \frac{I_F R_d}{(I_F + I_S)(R_u + R_d) - \beta T_D\left(\frac{R_u}{R_d} + 1\right) - V_{D0}} \right) \frac{\Delta I_F}{I_F} \quad (18)$$

$$\frac{\partial \alpha}{\partial I_S} \frac{\Delta I_S}{\beta} = \left( \frac{nk_B}{qB} \frac{-I_F R_d + \frac{R_d}{R_u + R_d} V_{D0}}{(I_F + I_S)(R_u + R_d) - \beta T_D\left(\frac{R_u}{R_d} + 1\right) - V_{D0}} \right) \frac{\Delta I_S}{I_S} \quad (19)$$

$$\frac{\partial \alpha}{\partial I_S} \frac{\Delta T_D}{\beta} = \left( \frac{nk_B}{qB} \frac{-\beta T_D}{(I_F + I_S)(R_u + R_d) - \beta T_D\left(\frac{R_u}{R_d} + 1\right) - V_{D0}} \right) \frac{\Delta T_D}{T_D} \quad (20)$$

$$\frac{\partial \alpha}{\partial n} \frac{\Delta n}{\beta} = \frac{\alpha}{\beta} \frac{\Delta n}{n} \quad (21)$$

Measurement error can be reduced by choosing proper circuit parameters. Equations (17-23) give us the relative error of $\alpha$ in terms of the relative error of: $R_u$, $R_d$, $I_F$, $I_S$, $I_D$, and n:

$$\frac{\Delta \alpha}{\beta} = e_1 \frac{\Delta R_u}{R_u} + e_2 \frac{\Delta R_d}{R_d} + e_3 \frac{\Delta I_F}{I_F} + e_4 \frac{\Delta I_S}{I_S} + e_5 \frac{\Delta T_D}{T_D} + e_6 \frac{\Delta n}{n} \quad (22)$$

Notice $e_1, e_2, \ldots, e_6$ are all functions of circuit parameters $I_F$, $I_S$, $R_u$, and $R_d$. Hence, it is possible to choose appropriate circuit parameters to minimize the measurement error.

Observe the following facts in particular:

Firstly, in general, increasing the value of $R_u + R_d$ while keeping $R_u/R_d$ a constant helps reduce the error ($e_1, e_2, \ldots, e_6$ are non-increasing function of $R_u + R_d$), especially the error introduced by $T_D$. However, $R_u + R_d$ cannot be arbitrarily large, if it is desired to avoid an output resistance that is too large.

Secondly, the value of $R_u/R_d$ plays an interesting role. When $R_u/R_d$ gets larger, the contributions of error sources $I_F + I_S$ would become smaller. However, the contributions of error sources $R_u$ and $R_d$ would be larger. Thus, there is a need to determine the value of $R_u/R_d$ based on relatively how well different error sources can be controlled. For example, in the situation that the resistors can be made very accurately and the error in $I_s$ is not that easy to control, we should make $R_u/R_d$ as large as possible.

Deriving the possible values of $R_u$ and $R_d$ in a practical setting by substituting in the typical values for:

$I_S$, $\beta$, n, q, $k_B$, and $V_{D0}$; and $(n = 1, k_B/q = 86 \text{ }\mu V/^\circ C., \beta = 40 \text{ }\mu V/^\circ C.,$ $T_D = 320 K, I_s = 10^{-9} A \text{ and } V_{D0} = 0.1V)$ which results in:

$$I_F = 10^{-9}\exp\left(\frac{1}{2}\left(\frac{R_u}{R_d} + 1\right)\right) + 4 \times 10^{-5}\frac{T_D}{R_d} + \frac{0.1}{R_u + R_d} + 10^{-9} \quad (22a)$$

Because $I_F$ cannot be made too large (the typical value of $I_F$ is in the range of $[10^{-6} A, 10^{-5} A]$), the above equation actually places a few constraints on the magnitude of the resistors:

$$10^{-5} \geq I_F > 10^{-9}\exp\left(\frac{1}{2}\left(\frac{R_u}{R_d} + 1\right)\right) \quad (23)$$

$$10^{-5} \geq I_r > 4 \times 10^{-5}\frac{T_D}{R_d} \quad (24)$$

$$10^{-5} \geq I_F > \frac{0.1}{R_u + R_d} \quad (25)$$

Assuming $T_D$ never exceeds 400K, the above equations can be further simplified to be $$R_u/R_d \leq 17.4, R_u + R_d \geq 100K \quad (26)$$

A possible choice of $R_u$, $R_d$ and $R_F$ can be $$R_u = 1500K\Omega, R_d = 100K\Omega, I_F = 2.98 \text{ }\mu A \quad (27)$$

Substituting $R_u$, $R_d$ and $I_F$ given by Equation (27) and the typical value of $I_S$, $\beta$, n, q, $k_B$, and $V_{D0}$ into the above equations (17-23), results in $$\frac{\Delta \alpha}{\beta} = -0.909\frac{\Delta R_u}{R_u} + 0.945\frac{\Delta R_d}{R_d} + \quad (28)$$
$$0.145\frac{\Delta I_F}{I_F} - 0.142\frac{\Delta I_S}{I_S} - 0.00780\frac{\Delta T_D}{T_D} + \frac{\Delta n}{n}$$

Notice that $R_u$ and $R_d$ are physically located close to each other. Hence, the spatial correlation might lead to the cancellation of the first two terms. Also observe that this setting suppresses the errors coming from $I_F$, $I_S$ and $T_D$ much better than the rest.

Measurement error reduction may result from a modified measurement methodology. Knowledge of the typical ambient temperature of the circuit can lead to further improvements in the process error reduction.

Equation (9) can be rearranged as $$T_M = \frac{V_M}{\alpha} - \left(1 - \frac{\beta}{\alpha}\right)(T_M - T_D) - \frac{R_d}{\alpha(R_u + R_d)} V_{D0} \quad (29)$$

Now the temperature $T_M$ can be estimated by $$T_M = \frac{V_M}{\alpha} - \frac{R_d}{\alpha(R_u + R_d)} V_{D0} \quad (30)$$

Assuming the measurement error of $\alpha$ is $\delta\alpha$ the measurement error now becomes $$-\frac{V_M}{\alpha}\frac{\delta\alpha}{\alpha} + \frac{R_d}{\alpha(R_u + R_d)}V_{D0}\frac{\delta\alpha}{\alpha} - \left(1 - \frac{\beta}{\alpha}\right)(T_M - T_D) =$$
$$-\left(T_M + \left(1 - \frac{\beta}{\alpha}\right)(T_M - T_D)\right)\frac{\delta\alpha}{\alpha} - \left(1 - \frac{\beta}{\alpha}\right)(T_M - T_D)$$

Because the value of $\alpha$ can be measured in the calibration phase, the relative error of the $\alpha$-measurement should be very small (~1/1000). On the other hand, the worst case value of $T_M - T_D$ should be less than 40° C. in a typical microprocessor due to spatial correlation. Substituting the worst case values of:

$T_M(360K)$ and $T_M - T_D(40K)$,
compared to (14), the magnitude is reduced by about 7~8 times.

Actually, the measurement error can be further reduced, if we notice that $T_M$ would always be larger than $T_D$ because the metal junction is placed at the hotspots, while the diode resides in a cooler region. In turn estimate $T_M$ using the following $$T_M = \frac{V_M}{\alpha} - \frac{1}{2}\left(1 - \frac{\beta}{\alpha}\right)|T_M - T_D|_{worst} - \frac{R_d}{\alpha(R_u + R_d)}V_{D0} \qquad (32)$$

which further reduces the measurement error by one-half.

The microprocessor chip 54 is one example of a logic unit. Moreover, the chip 54 may be any type of logic unit. The logic unit executes operating logic that can define various models, conversions, controls, data management, and/or other regulation functions. This operating logic may be in the form of dedicated hardware, such as a hardwired state machine, programming instructions, and/or a different form as would occur to those skilled in the art. The logic unit may be provided as a single component or a collection of operatively coupled components; and may be comprised of digital circuitry, analog circuitry, or a hybrid combination of both of these types. When of a multi-component form, it may have one or more components remotely located relative to the others. In such a circumstance, a thermocouple array may be provided at each location. Also, the logic unit can include multiple processing units arranged to operate independently, in a pipeline processing arrangement, in a parallel processing arrangement, and/or such different arrangement as would occur to those skilled in the art. In one embodiment, the logic unit is a programmable microprocessing device of a solid-state, integrated circuit type that includes one or more processing units and memory. The logic unit can include one or more signal conditioners, modulators, demodulators, Arithmetic Logic Units (ALUs), Central Processing Units (CPUs), microcontrollers, limiters, oscillators, control clocks, amplifiers, signal conditioners, filters, format converters, communication ports, clamps, delay devices, memory devices, and/or different circuitry or functional components as would occur to those skilled in the art to perform the desired operations.

Figure 3:
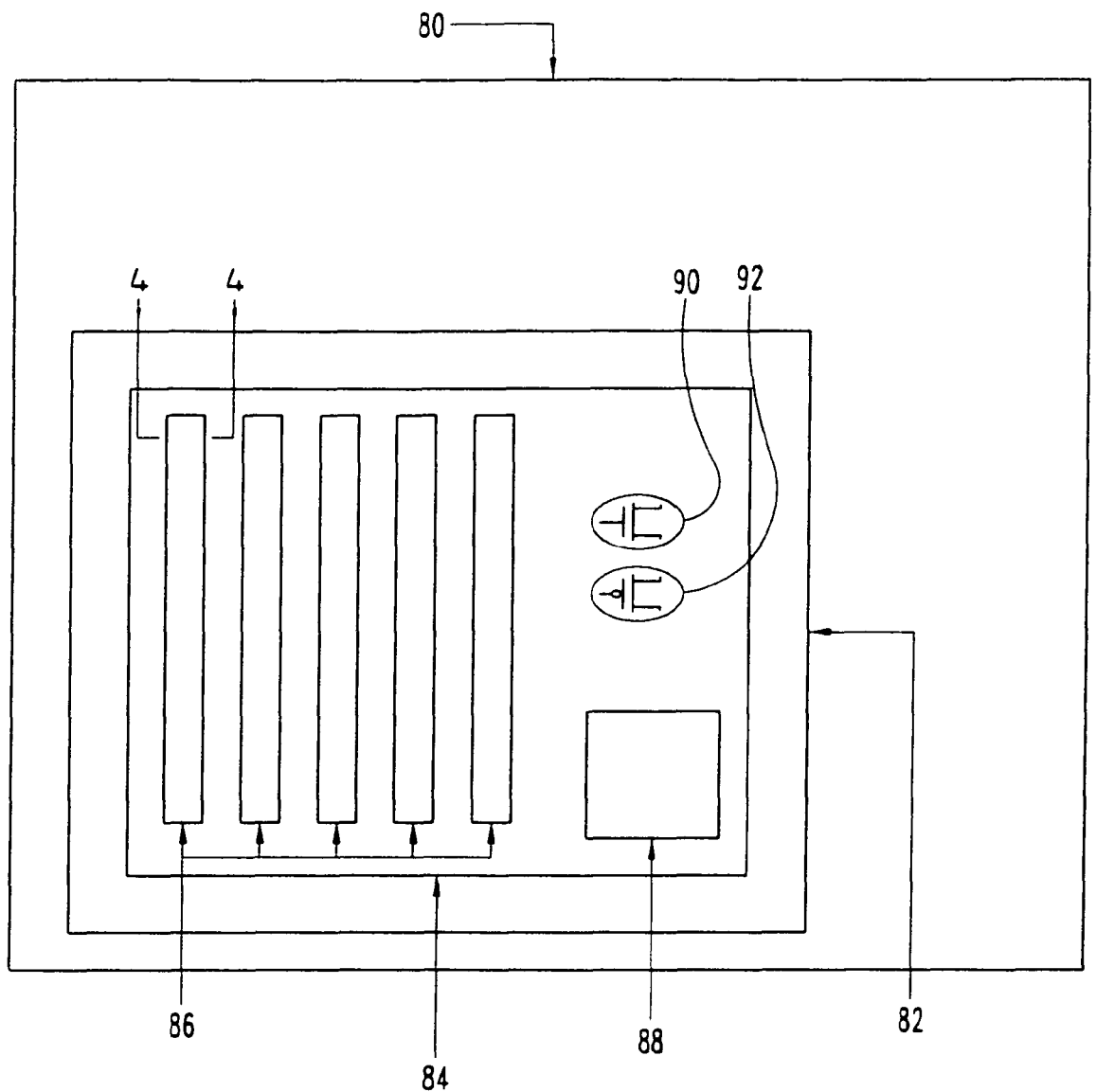
FIG. 3 is a schematic block diagram of a computer including a logic unit having a thermocouple array and accessory circuitry.

FIG. 3 shows a block diagram of a computer 80 having a logic unit 82 such as a microprocessor. The logic unit includes logic unit circuitry 84 for, among other things, receiving, processing, and transmitting signals and data and the like. A thermocouple array 86 and accessory circuitry 88 are provided on the logic unit 82, and the logic unit 82 includes logic unit circuitry 84 to monitor the temperature. The computer 80 may be any type of computer including, but not limited to, a laptop, a desktop, a tablet, a cell phone, a smartphone, a server, a distributed computing system, or any other computing system that has a logic unit for processing signals and/or data and the like. The logic unit 82 also includes a n-type FET 90 and a p-type FET 92 that may be arranged to form CMOS circuitry.

Figure 4:
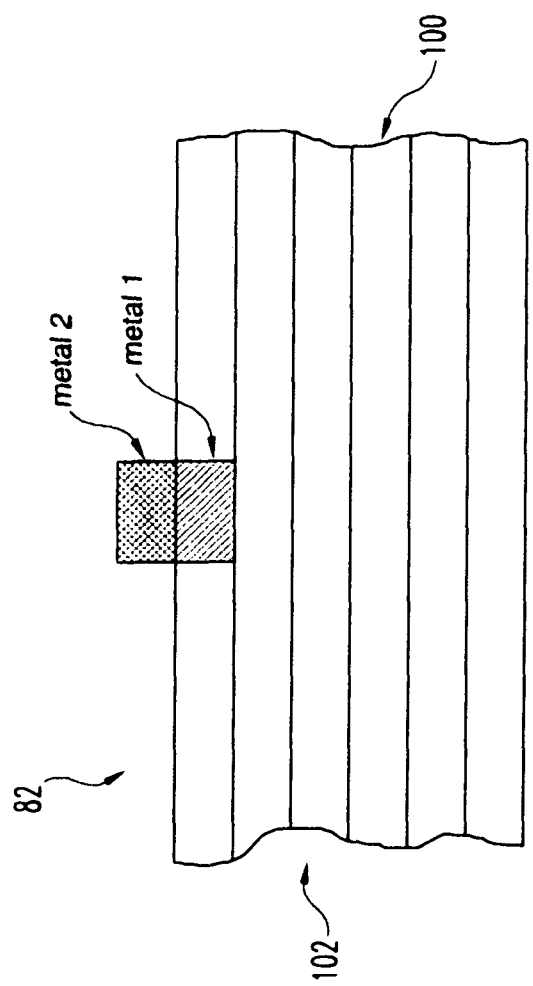
FIG. 4 is a partially schematic, cutaway view of the logic unit of FIG. 3.

FIG. 4 shows a cutaway view of the logic unit 82 in FIG. 3. The logic unit 82 includes at least one dielectric layer 100 and at least one semiconductor layer 102. In addition, FIG. 4 shows metal 1 and metal 2 in contact with each other to form a thermocouple that may be used to monitor the temperature of the various layers of the logic unit 82.

The thermocouple array may be used to monitor and/or calculate the temperature of a region of the integrated circuit chip or logic unit. Based on the temperature reading, the integrated circuit chip may take a variety of actions. For example, if the temperature reading is higher than a predetermined value, the integrated circuit chip may stop all processing on the integrated circuit chip except for performing subsequent temperature readings. In another embodiment, the integrated circuit chip reduces the processing speed of the integrated circuit chip such as adjusting the clock speed and/or frequency of the integrated circuit chip. In another embodiment, the integrated circuit chip adjusts the voltage on the chip. In another embodiment, the integrated circuit chip scales the voltage/frequency of the chip. In yet another embodiment, the integrated circuit chip prevents processing in certain regions of the integrated circuit chip where the temperature reading is outside of a predetermined temperature range. For example, if the temperature is too high near certain ports, those ports may be shut down or not used until the temperature drops. In another embodiment, the integrated circuit chip changes an operating characteristic of the integrated circuit chip, for example, by adjusting the speed of the chip, not utilizing particular regions of the chip, scaling the clock, scaling the voltage/frequency, adjusting the voltage on the chip, and the like. In yet another embodiment, the integrated circuit chip returns to normal processing or processing under normal operating characteristics and/or conditions after a subsequent temperature reading is at or near a predetermined value. In another embodiment, the integrated circuit chip alerts a user when the temperature reading is outside of a predetermined range.

Crosstalk signals can cause the voltage signals produced by the thermocouples to fluctuate. One circuit technique that may be used to suppress the interference of crosstalk is to add shielding along the metal strips forming the thermocouple array. However, even without shielding, crosstalk signals are unlikely to introduce significant amount of inaccuracy to our sensor design. Crosstalk signals are relatively high-frequency signals whose time constant (in the order of nanoseconds) is several orders of magnitude smaller than the thermal constant of the chip (in the order of milliseconds). By sampling the voltage signals produced by the thermocouples in multiple consequent clock cycles, the fluctuation caused by the crosstalk signals can be effectively filtered out.

In another embodiment, an alternative analysis may be used to analyze the temperature sensor. For example, according to the Seebeck effect, when the junction between two dissimilar metals is held at a different temperature than the two leads, a voltage arises at the leads proportional to the lead-to-junction temperature difference:

$$\Delta V = \alpha(T_{junction} - T_{leads}) \qquad (33)$$

Here, $\alpha$ is a constant called the Seebeck coefficient of the thermocouple. The value of $\alpha$ depends on types of metals forming the thermocouple. The components of the thermocouple should be chosen so that they may be integrated into CMOS. Al and Cu can be used to form the metal routing layers. However, the Seebeck coefficient of Al—Cu thermocouple is only 3.54 µV/° C. Preferred candidates for thermocouple metals are Ni and Cu ($\alpha$=17.39 µV/° C.). This only requires addition of one new metal type to the process. The Seebeck coefficient can be further improved by introducing two new metals: Ni and Cr ($\alpha$=40.94 µV/° C.).

As discussed above, the thermal reference circuitry 14, shown in FIG. 1, includes a current source 70, a diode 72, and two resistors 74, 76. The absolute temperature in this region is denoted by $T_D$. The forward voltage drop of the diode $V_D$ depends linearly on $T_D$ according to the equation (1).

Here $V_{D0}$ is a constant, representing the forward junction voltage at 0 Kelvin (by linear extension). n is the ideality factor of the diode. $k_B$ and q are Boltzmann constant and electron charge. $I_D$ is the current going through the diode, and $I_S$ is the saturation current of the diode. The two resistors $R_u$ and $R_d$ form a voltage divider. The voltage drop on resistor $R_d$ is $$V_{Rd} = \frac{R_d}{R_u + R_d} V_{D0} + \frac{R_d}{R_u + R_d} \frac{nk_B}{q} \ln\left(\frac{I_D}{I_S} + 1\right) \cdot T_D \quad (34)$$

The temperature coefficient of the reference voltage $V_{Rd}$ by $\gamma$, $$\gamma = \frac{R_d}{R_u + R_d} \frac{nk_B}{q} \ln\left(\frac{I_D}{I_S} + 1\right) \quad (35)$$

The Seebeck effect results in a voltage difference $\alpha(T_M - T_D)$ at the metal leads. Adding up $V_{Rd}$ and the Seebeck voltage yields $$V_M = \gamma \cdot T_M + \frac{R_d}{R_u + R_d} V_{D0} - (\gamma - \alpha) \cdot (T_M - T_D) \quad (36)$$

Dividing by $\gamma$ and solving for $T_M$, separates the expression into a $T_D$-independent term (left) and a $T_D$-dependent term (right):

$$T_M = \left(\frac{V_M}{\gamma} - \frac{R_d}{\gamma(R_u + R_d)} V_{D0}\right) - \left(\frac{\gamma - \alpha}{\gamma}\right)(T_M - T_D) \quad (37)$$

The values of $R_u$ and $R_d$ and $I_d$ should be chosen such that $\gamma$ is equal to $\alpha$. As a result, the second term of the above equation, which is dependent on $T_D$, can be eliminated. Then, $T_M$ can be estimated independent of $T_D$ as:

$$T_M = \frac{V_M}{\gamma} - \frac{R_d}{\gamma(R_u + R_d)} V_{D0} \quad (38)$$

The estimation error associated with equation (38) has three components. Firstly, the linear relation given by equation (1) is not accurate if the variation of temperature $T_D$ is too large. Secondly, process variations might change $\gamma$ from the intended value, rescaling the $T_D$-independent term in (38). Thirdly, the $T_D$-dependent term $(1-\alpha/\gamma)(T_M - T_D)$ in equation (37) is not guaranteed to be zero, again due to process variations, leading to fluctuations in the temperature reading as the reference diode temperature varies.

The first error source of diode non-linearity can be eliminated if the thermal reference point circuitry resides in an area (such as the corner) where the temperature variation is comparatively small. In this smaller temperature variation range, the linearity of the diode can be safely assumed. In the regions of the chip where the temperature varies widely, the bimetallic thermocouples exhibit excellent linearity. Thus, the combination of the reference point circuitry and the bimetallic thermocouples is generally able to guarantee the voltage $V_M$ to be a linear function of temperature within a significant temperature range.

The second error source in the $T_D$-independent term of equation (38) can be mitigated by calibration. In the sensor calibration phase, the entire chip is placed in a cabinet which can provide constant ambient temperatures $T_A$ and $T'_A$. Then, according to equation (36):

$$V_M = \gamma \cdot T_A + \frac{R_d}{R_u + R_d} V_{D0} \quad (39)$$

$$V'_M = \gamma \cdot T'_A + \frac{R_d}{R_u + R_d} V_{D0} \quad (40)$$

Measuring the voltages $V_M$ and $V'_M$ during the calibration phase and solving the above linear equations gives the actual values of $\gamma$ and $R_d R_{D0}/(R_u+R_d)$. With these actual values, soft-compensation can be done by reprogramming the ADC 16.

Notice that even with a calibrated value for $\gamma$, the third error source in the $T_D$ dependent term of Equation (37) cannot be controlled since it is proportional to changes in $T_D$, the temperature of the diode. However, this error can be suppressed by choosing circuit parameters which minimize the deviation of $\gamma$ from $\alpha$. With practical and feasible choices on the design parameters, the thermal accuracy can be less than 1° C. at maximum temperature.

While the invention has been illustrated and described in detail in the drawings and foregoing description, the same is to be considered as illustrative and not restrictive in character, it being understood that only the selected embodiments have been shown and described and that all changes, modifications and equivalents that come within the spirit of the inventions as defined herein are desired to be protected.

One invention of the present application is an apparatus, comprising: a semiconductor integrated circuit chip defined by a stack of several interconnected layers including at least two layers of dissimilar metal patterned to define an array of integrated bimetallic thermocouples spaced apart from one another, each of the thermocouples being operatively connected to a thermal management circuit defined by the integrated circuit chip. Further inventive variations of this apparatus include: the integrated circuit chip defining a microprocessor, one or more of the layers being of a semiconductor type, one or more of the layers being of a dielectric type, the thermal management circuit including means for reducing high operation temperatures, at least a portion of the integrated circuit chip defining integrated circuitry of a CMOS digital type, at least a portion of the integrated circuit chip defining integrated circuitry having field effect transistors of opposite polarity, the integrated circuit chip defining a thermal reference circuit, and/or at least one of the first type of metal and the second type of metal includes copper.

Another invention is a method, comprising: preparing circuitry of an integrated circuit device from a number of layers of different composition, the layers including at least two metallic layers of dissimilar metals; lithographically patterning the metallic layers to define a number of spaced apart bimetallic thermocouple junctions positioned along the circuitry; and operatively coupling the thermocouple junctions to a thermal management device for the integrated circuit device. Further inventive variations of this method include: defining a microprocessor with the circuitry, one or more of the layers being of a semiconductor types, one or more of the layers being a dielectric type; defining the thermal management circuit with the circuitry, providing a thermal reference device for the thermocouples, reducing high operation temperatures, at least a portion of the circuitry being of a CMOS digital type, at least a portion of the circuitry being defined with field effect transistors of opposite polarity, and/or at least one of the first type of metal and the second type of metal including copper.

Other inventions include unique integrated circuit sensing techniques including an integrated array of bimetallic thermocouples, unique methods of making and using the same with integrated circuitry, and various other unique apparatus, devices, systems, and methods relating to the same. Further embodiments, inventions, forms, objects, features, advantages, aspects, and benefits of the present application are otherwise set forth or become apparent from the description and drawings included herein, and for any claims that follow.

The invention claimed is:

1. An apparatus, comprising:
a semiconductor integrated circuit chip defined by a stack of several interconnected layers including at least two layers of dissimilar metal patterned to define an array of integrated bimetallic thermocouples spaced apart from one another, each of the thermocouples being operatively connected to a thermal management circuit defined by the integrated circuit chip.

2. The apparatus of claim 1, wherein at least a portion of the integrated circuit chip defining a logic unit.

3. The apparatus of claim 2, wherein the logic unit is a microprocessor.

4. The apparatus of claim 1, wherein one or more of the layers being of a semiconductor type.

5. The apparatus of claim 1, wherein one or more of the layers being of a dielectric type.

6. The apparatus of claim 1, wherein the thermal management circuit including means for reducing elevated operation temperatures.

7. The apparatus of claim 1, wherein at least a portion of the integrated circuit chip defining integrated circuitry having field effect transistors of opposite polarity.

8. The apparatus of claim 1, wherein at least a portion of the integrated circuit chip defining a thermal reference circuit.

9. The apparatus of claim 8, wherein the thermal reference circuit is structured to minimize error in temperature readings.

10. The apparatus of claim 1, wherein at least one of the first type of metal and the second type of metal includes copper.

11. A method, comprising:
preparing circuitry of an integrated circuit device from a number of layers of different composition, the layers including at least two metallic layers of dissimilar metals;
patterning the metallic layers to define a number of spaced apart bimetallic thermocouple junctions positioned along the circuitry; and
operatively coupling the thermocouple junctions to a thermal management device for the integrated circuit device.

12. The method of claim 11, further comprising:
defining a logic device with the circuitry.

13. The method of claim 12, wherein the logic device is a microprocessor.

14. The method of claim 11, wherein one or more of the layers being of a semiconductor type.

15. The method of claim 11, wherein one or more of the layers being a dielectric type.

16. The method of claim 11, further comprising:
defining the thermal management device with the circuitry.

17. The method of claim 11, further comprising:
providing a thermal reference device for the thermocouples.

18. The method of claim 17, wherein the thermal reference device is formed as part of the thermal management device.

19. The method of claim 11, further comprising:
reducing elevated operation temperatures.

20. The method of claim 11, wherein at least a portion of the circuitry being defined with field effect transistors of opposite polarity.

21. The method of claim 11, wherein at least one of the first type of metal and the second type of metal including copper.

22. The method of claim 11, wherein the patterning step is performed by lithography.

23. The method of claim 17, wherein the thermal reference device is structured to minimize error in temperature readings.

* * * * *